United States Patent [19]
Goodman et al.

[11] Patent Number: 5,822,042
[45] Date of Patent: Oct. 13, 1998

[54] THREE DIMENSIONAL IMAGING SYSTEM

[75] Inventors: Douglas Seymore Goodman, Yorktown Heights, N.Y.; Charles Albert Rudisill; Daniel John Whittle, both of Apex, N.C.

[73] Assignee: International Business Machines Corporation, Armonk, N.Y.

[21] Appl. No.: 976,162

[22] Filed: Nov. 12, 1992

[51] Int. Cl.$^6$ .................................. G03B 27/42
[52] U.S. Cl. ............................................. 355/53
[58] Field of Search ............................ 355/53, 67, 52; 352/86, 43; 359/663

[56] References Cited

U.S. PATENT DOCUMENTS

| | | | |
|---|---|---|---|
| 2,380,210 | 7/1945 | Bennett | 359/663 |
| 2,445,594 | 7/1948 | Bennett | 359/663 |
| 3,506,344 | 4/1970 | Petit | 352/86 |
| 3,694,080 | 9/1972 | Malsky | 355/53 |
| 3,748,015 | 6/1971 | Offner | 350/55 |
| 4,758,864 | 7/1988 | Endo et al. | 355/53 |
| 4,867,545 | 9/1989 | Wakimoto et al. | 359/663 |

FOREIGN PATENT DOCUMENTS 59160144   1/1985   Japan .
01054454   3/1989   Japan .

OTHER PUBLICATIONS

IBM Technical Disclosure Bulletin, vol. 30, No. 3, Aug. 1987 New York US pp. 1020–1024.
"Fast Automated Projection System for Printed Circuit Boards".
IBM Technical disclosure Bulletin, vol. 13, No. 4, Sep. 1970, New York, US pp. 879–880.
"Three–Dimensional Photolithographic Mask".

*Primary Examiner*—David M. Gray
*Attorney, Agent, or Firm*—Edward H. Duffield; John J. Timar

[57] ABSTRACT

The photolithography tool of the present invention in its simplest embodiment includes an afocal lens system and a three-dimensional master or mask. The three-dimensional mask is located within the object space of the afocal lens system and is imaged onto a three-dimensional circuit carrier or substrate located within the imaging space of the afocal lens system. By using an afocal lens, with which persons skilled in instrumental optics are familiar, a system can be designed for which the object space is identical to the imaging space for unity magnification. As a result, a mask can be used in which the surface contour and pattern to be imaged is identical to the desired substrate surface and pattern, thereby simplifying mask design.

10 Claims, 15 Drawing Sheets

THREE DIMENSIONAL IMAGING SYSTEM

FIELD OF THE INVENTION

The present invention relates to a system and technique for three-dimensional projection imaging and photolithography. More particularly, the present invention relates to a system and technique for enabling circuits and other patterns to be exposed on three-dimensional surfaces having large non-planar variations.

DESCRIPTION OF THE RELATED ART

The history of electronics has included a race to smaller and smaller products. Consumer demand, scientific advances in a number of areas, including semiconductor chips, and manufacturing economics have all fueled this race. Components that perform multiple functions in a small volume are prized commodities. In turn, reliability has become critical. An individual component in an electronic product is difficult if not impossible to replace, given the volume of space in which the components which comprise the product are packed. Manufacturing is more difficult and reliability can be compromised when more components which are small are required for the product. When a large number of components comprise a product, the number of electrical connections within the product increases as does the chance of the product failing due to the failure of a single electrical connection.

Component carrier technologies, e.g. circuit boards and ceramic substrates, have witnessed limited advances during the present integration revolution. For the most part, the components which comprise the electrical product are placed on a carrier or board. These components include semiconductor chips, resistors, capacitors, keypads, etc. The vast majority of the circuit boards are substantially flat. If all the components will not fit on a single board, multiple boards are required, mandating connections therebetween via expensive cables, etc. Further, flat, two dimensional boards do not lend themselves to enhanced manufacturing efficiencies, since the size and shape of the product become defined by the inherent limitations of two dimensional boards, particularly with the trend towards smaller and smaller sizes and weights (e.g. portable PC's, cellular communication equipment, etc.).

One proposed solution for improving manufacturing efficiencies and product reliability and for solving sizing problems has been to place components on a non-planar surface. This solution has the ability to increase electrical/mechanical integration and reduce the number of parts required for a product. The result is a reduction in assembly time and an increase in volume utilization, thereby providing cost savings while improving quality and reliability and enabling industrial design improvements. For example, ever smaller devices could be designed more easily since the required tolerances within a device could be reduced, the device could have fewer interconnections, the need for cables could be reduced or eliminated, etc.

However, no technique has been designed to date which will provide the efficiencies necessary to permit such a scheme to be employed extensively. The principal impediment to the successful introduction of circuits formed on truly three-dimensional surfaces has been the lack of a high yield and fine resolution imaging process. Connections between components mounted on a board are still formed by relatively old techniques, the most common of which include exposing a radiation sensitive material on the surface of the board to radiation via a mask having the desired pattern, and then chemically etching or treating the board to obtain the desired pattern thereon. Typically, resolution is sacrificed when anything except boards with very limited three-dimensional variations are employed. This is due to limited depth of focus and distortion problems. This results in cards having very limited non-planar characteristics, and given that, manufacturing yields are poor due to strict tolerances and inadequate resolution. Transfer printing and conformal three-dimensional contact masks have been proposed as a solution. However, these masks proved to be expensive to fabricate and fragile, with contact difficult to achieve and maintain. The result was a low yield mask that required constant replacement and yielded only limited resolution. While relatively simple circuits on surfaces with limited non-planar variations and/or low resolution proved possible, though subject to the above limitations, substantially three-dimensional circuit boards of significant complexity and fine resolution proved to be impossible to realize.

Direct projection and exposure of a circuit on a non-planar surface through an appropriate mask using collimated light has also been employed to obtain non-planar circuits. However, the surface being exposed must be very close to the mask, or resolution of the circuit lines becomes a significant problem. This restriction also limits this technique to the production of circuits with small non-planar features and low resolution.

Given the above, a need clearly exists for a technique that will permit large scale production of circuits on truly three-dimensional surfaces.

OBJECTS OF THE INVENTION

An object is to provide a method for imaging on three-dimensional surfaces.

Another object is to provide a method for allowing photolithography on three-dimensional (and two-dimensional) surfaces.

Accordingly, yet another object of the present invention is to provide a technique for producing circuits on three-dimensional surfaces.

Yet another object of the present invention is to provide a technique for reducing the number of parts necessary in the assembly of electronic devices.

Still another object of the present invention is to provide a technique for exposing high resolution circuits on non-planar surfaces.

A further object of the present invention is to provide a technique for exposing circuits having a large depth of focus.

SUMMARY OF THE INVENTION

The present invention utilizes the known process of photolithography, heretofore only used for imaging circuits on substantially twodimensional planar surfaces, to expose high resolution circuits on non-planar surfaces. Because the non-contact method of photolithography is implemented, higher yield with less degradation of the master is possible than with presently used contact methods. The novel use of photolithography for projecting circuit patterns on three-dimensional circuit carriers is made possible by a specialized photolithography tool.

The photolithography tool of the present invention in its simplest embodiment includes an afocal lens system and a three-dimensional master or mask. The three-dimensional mask is located within the object space of the afocal lens system and is imaged onto a three-dimensional circuit carrier or substrate located within the imaging space of the afocal lens system. By using an afocal lens, with which persons skilled in instrumental optics are familiar, a system can be designed for which the object space is identical to the imaging space for unity magnification. As a result, a mask can be used in which the surface contour and pattern to be imaged is identical to the desired substrate surface and pattern, thereby simplifying mask design.

Because the afocal lens system of the invention directly images a three-dimensional image into a three-dimensional object, the use of three-dimensional circuit carriers is not unduly limited by the depth of focus capability. The afocal lens system can be made doubly telecentric so that even when defocus occurs, the scale of the image is maintained. Also, the exact origin position of the mask in the object space is not critical, providing greater manufacturing flexibility. The imaging/photolithography tool may be implemented using a variety of illumination, mask, and process designs, depending on the requirements and desired attributes of the product.

DETAILED DESCRIPTION OF THE PREFERRED EMBODIMENT OF THE INVENTION

Figure 1:
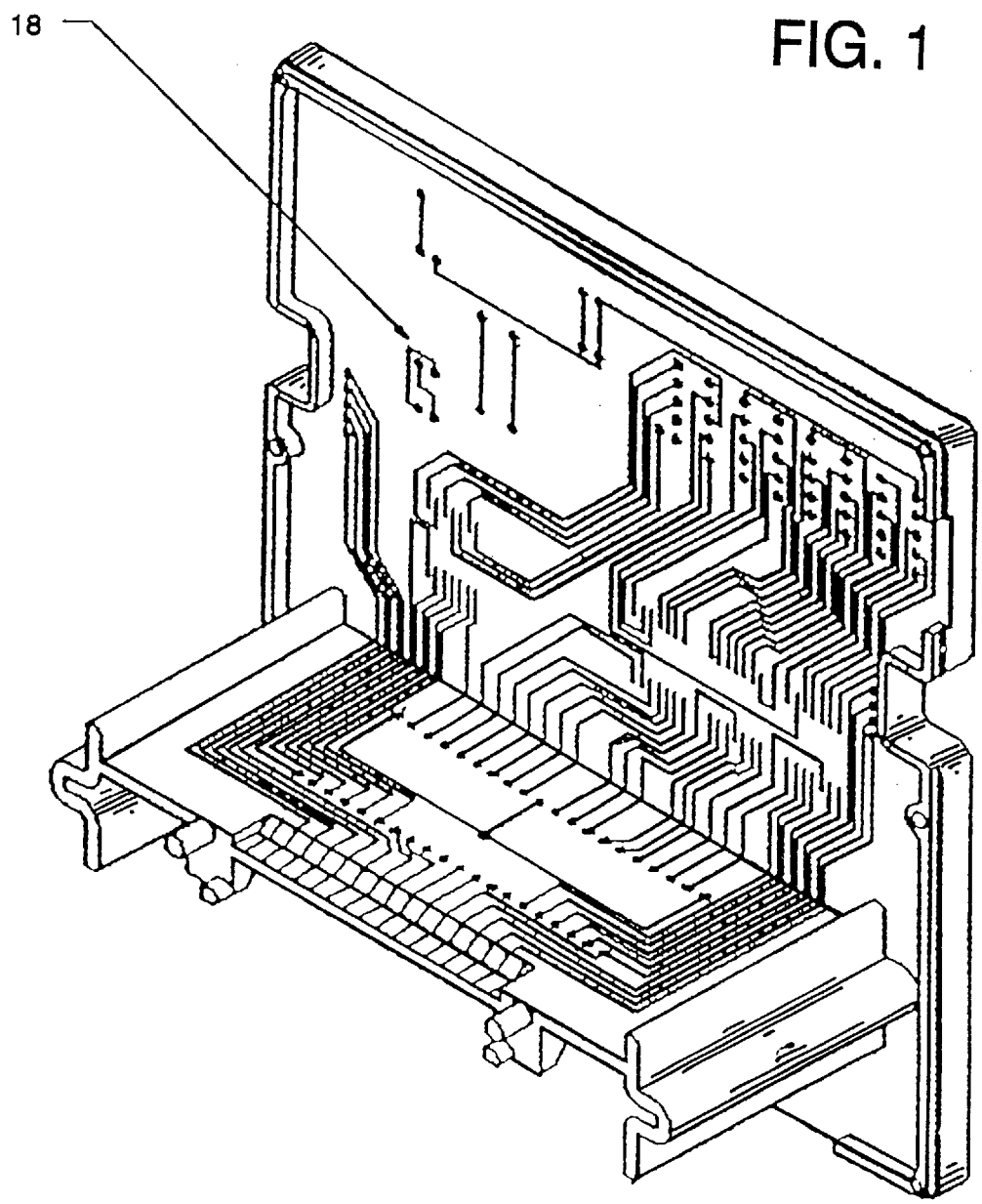
FIG. 1 is a perspective view of a typical three-dimensional circuit carrier or substrate with a circuit pattern imprinted thereon.

Referring now to the drawings, the photolithography tool of the present invention is shown therein and denoted generally by the numeral 10. Photolithography tool 10 includes a three-dimensional mask or master 12 and an afocal lens system 14. A circuit pattern 12a is imprinted on mask 12. In the preferred embodiment, photolithography tool 10 is designed for use with an illuminator, indicated generally by the numeral 16. Illuminator 16 provides directional light through the mask and lens system, the resulting image of circuit pattern 12A is projected onto a targeted three-dimensional substrate or circuit carrier 18. Typically, circuit carrier 18 is coated with a photosensitive material so that the projected image may be exposed thereon. An example of three-dimensional substrates presently in use is shown in FIG. 1.

The advantages of the present invention are accomplished by the use of an afocal lenses system 14. The properties of afocal lenses are known to those skilled in the photolithographical and instrumental optics arts, and such lenses are presently used in applications other than those herein described. In the present invention, the ability to remain within the depth of focus on substrates with large non-planar features is made possible by the use of an afocal lens and three-dimensional master 12.

To understand the advantages and operation of afocal lens system 14, it is helpful to examine the operation and disadvantages of non- afocal lens systems. Although lenses are typically thought of as imaging planar objects on a planar receiving surface, they actually function more generally. Both afocal and non-afocal lenses image entire three-dimensional spaces. However, afocal and non-afocal lenses image these three-dimensional spaces differently.

Figure 2:
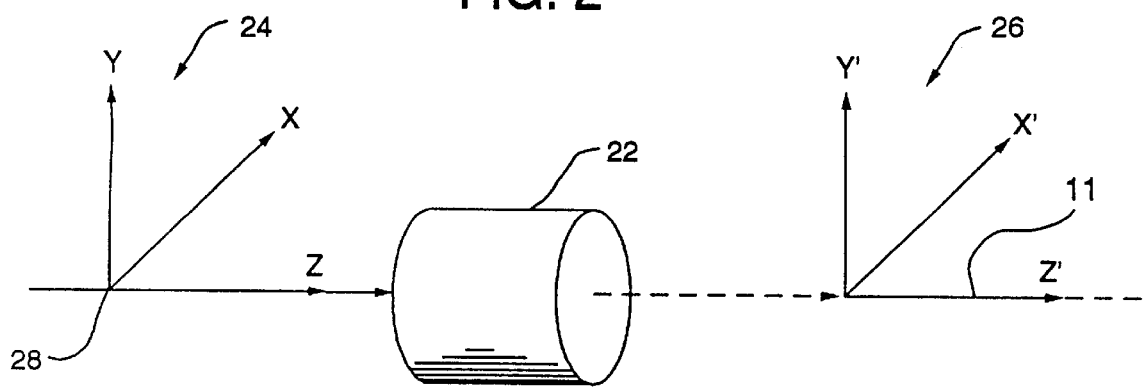
FIG. 2 is a perspective view of a non-afocal lens with an associated coordinate system.

Referring now to FIG. 2, a non-afocal lens with principal focal length f is shown. Objects placed in object space 24 are imaged by non-afocal lens 22 onto image space 26. As shown, a coordinate system is set centered at the object space focal point 28 such that the z-axis corresponds to lens axis 11. Any given object point with coordinates (x,y,z) will have an image point with coordinates (x',y',z'), where:

$x'=xf/z$ $y'=yf/z$ $z'=f^{**}2/z$

As a result of the above equations, a mask for imaging a circuit pattern on a three-dimensional substrate would be difficult and complicated to design and make. In addition, the mask and substrate must be precisely positioned within the object and image spaces. A two-dimensional mask could not be used because imaged points would only be in focus on one plane of the three-dimensional image surface. If a three-dimensional mask is used with a non-afocal lens, the mask must be designed to compensate for distortion in the x-dimension, the y-dimension, and the z-dimension. This would require modifications in the surface profile of the master as well as in the circuit pattern (e.g. tapered lines and elliptical curves). Although such a design is theoretically possible, it is highly impractical.

Figure 3:
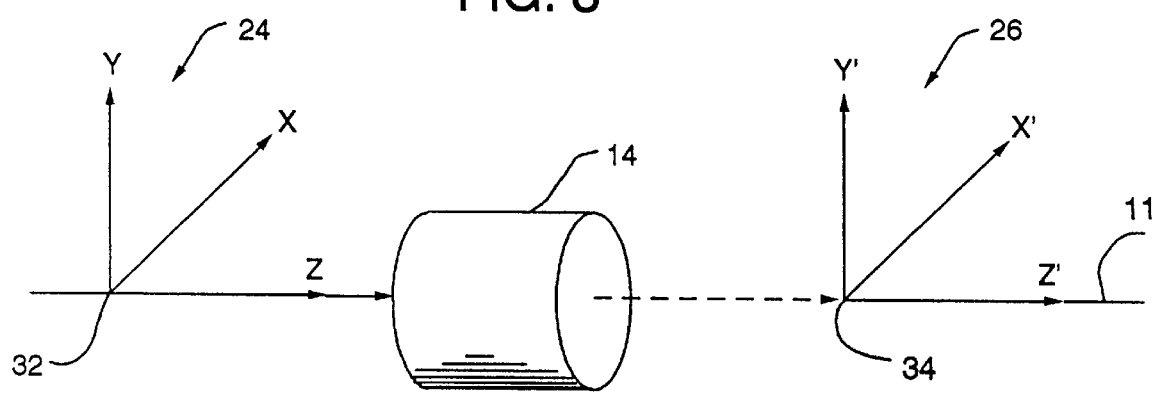
FIG. 3 is a perspective view of an afocal lens with an associated coordinate system.

The use of an afocal lens allows a mask to be used in which the surface profile and features to be imaged are identical to the target substrate surface. An afocal lens has a constant transverse magnification, m, and a constant axial magnification, m**2 (in air). Referring to FIG. 3, a coordinate system is set centered at axial object point origin 32 such that the z-axis corresponds to lens axis 11. Axial object point origin 32 has corresponding image point origin 34. Any given object point with coordinates (x,y,z) will have a corresponding image point (x',y',z'), where:

x'=mx
y'=my
z'=(m**2)z

Though not required for implementation, the afocal lens system can be more easily illustrated if a unity magnification of m=+1 or m=−1 is used. If magnification of m=+1 is applied, object and image points will be related as follows:

x'=x
y'=y
z'=z

Figure 4A:
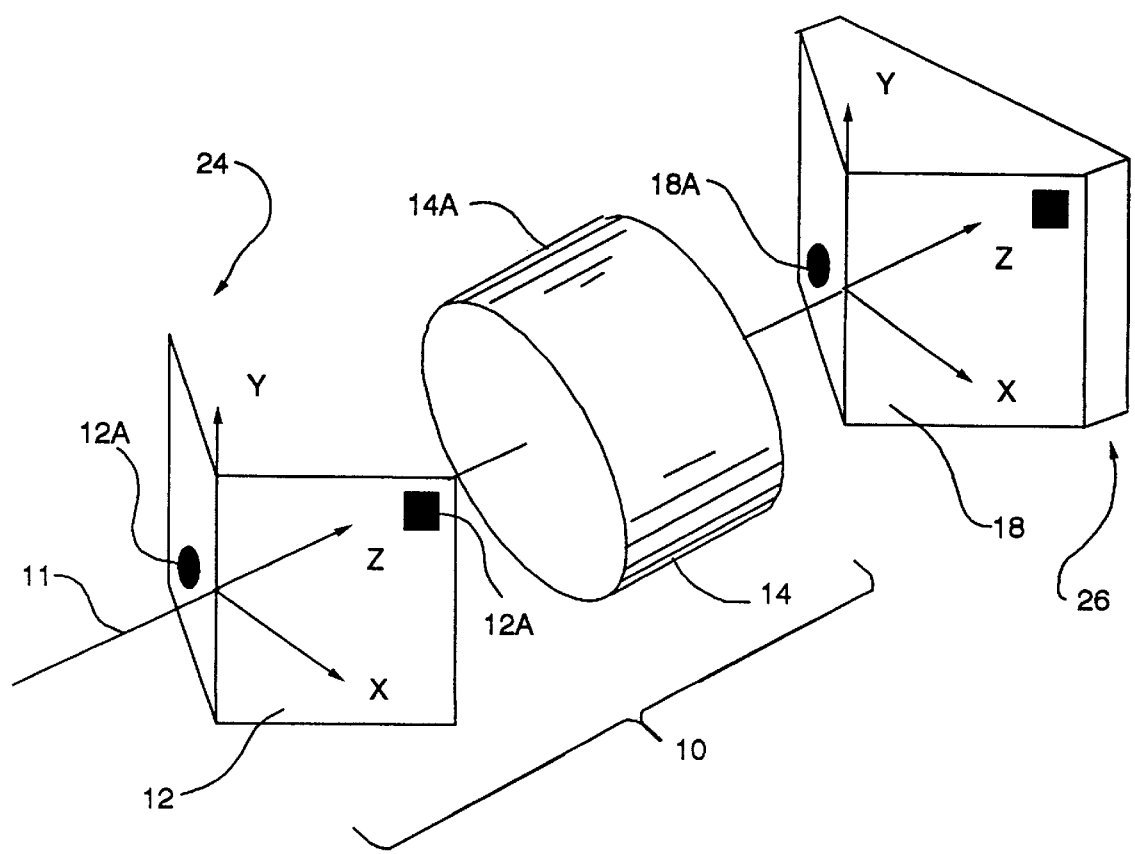
FIG. 4A is a perspective view of a positive unity magnification, m=+1, afocal lens imaging a three-dimensional object.
Figure 4B:
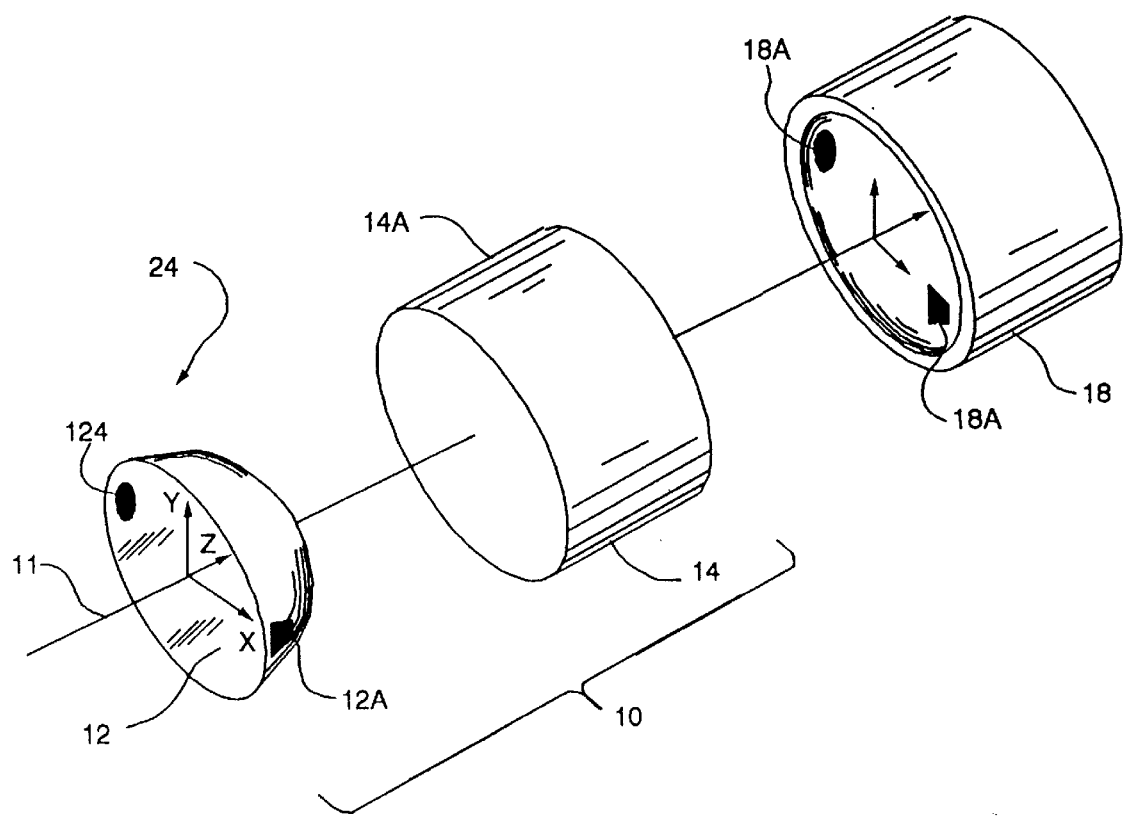
FIG. 4B is a perspective view of a positive unity magnification, m=+1, afocal lens imaging a spherical object.
Figure 5:
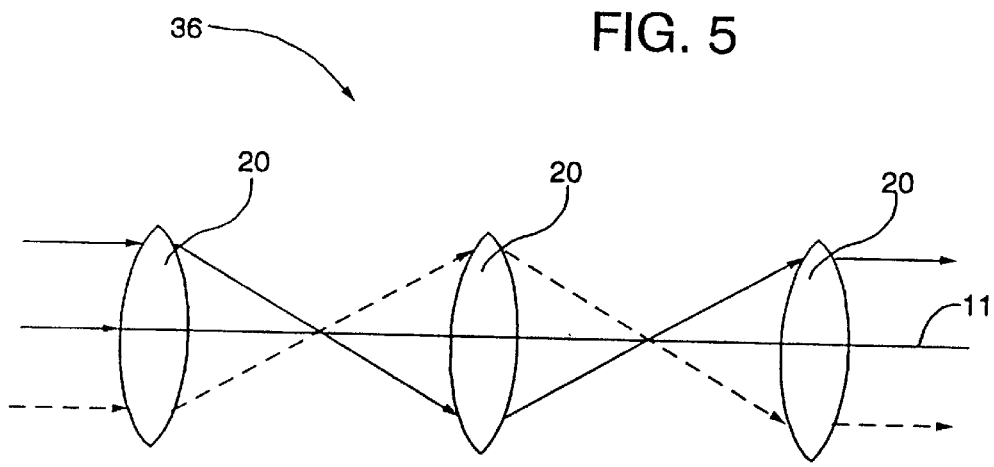
FIG. 5 is a side elevational view of a particular m=+1 afocal lens system demonstrating the effect of the same on collimated light.
Figure 6:
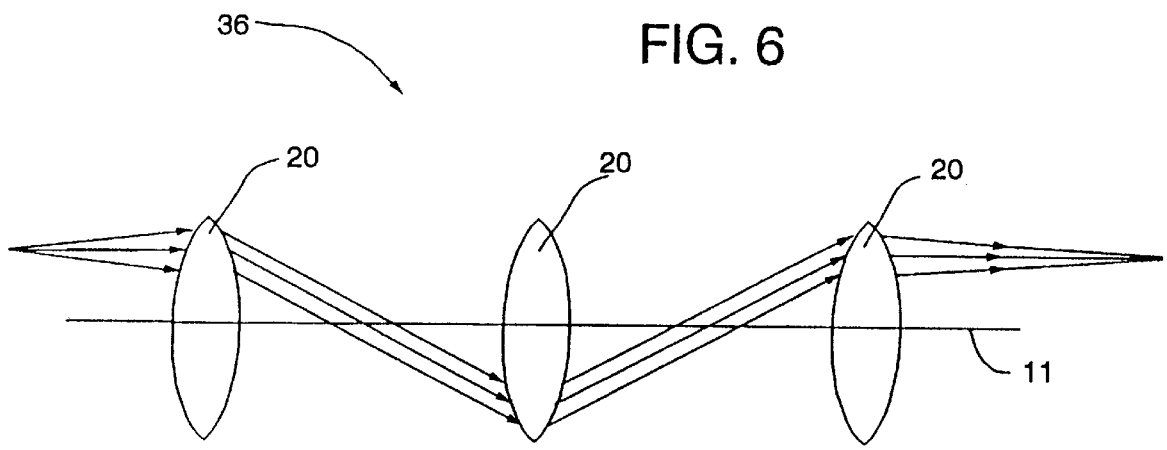
FIG. 6 is a side elevational view of an m=+1 afocal lens system imaging a point.

As shown in FIGS. 4A and 4B, this relationship will make image space 26 identical to object space 24. FIG. 5 and FIG. 6 shows a simple embodiment of an m=+1 afocal lens system, denoted generally as 36, with three identical focal length lens elements 20 separated by twice their focal length. FIG. 5 shows the lenses' effect on collimated light. FIG. 6 demonstrates the imaging of a single point by lens system 36.

If a magnification of m=−1 is used, the object and image points are related as follows:

x'=−x
y'=−y
z'=z

Figure 7:
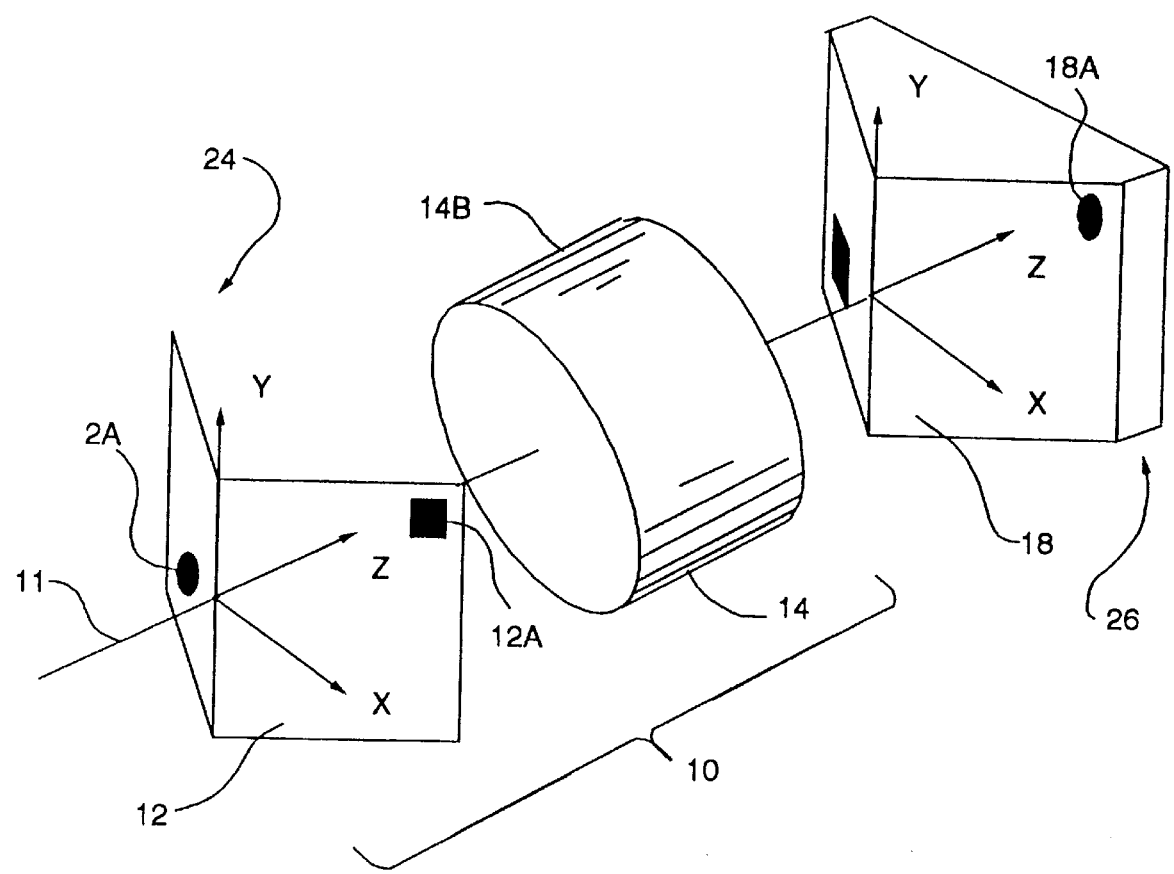
FIG. 7 is a perspective view of a negative unity magnification, m=−1, afocal lens system imaging a three-dimensional object.
Figure 8:
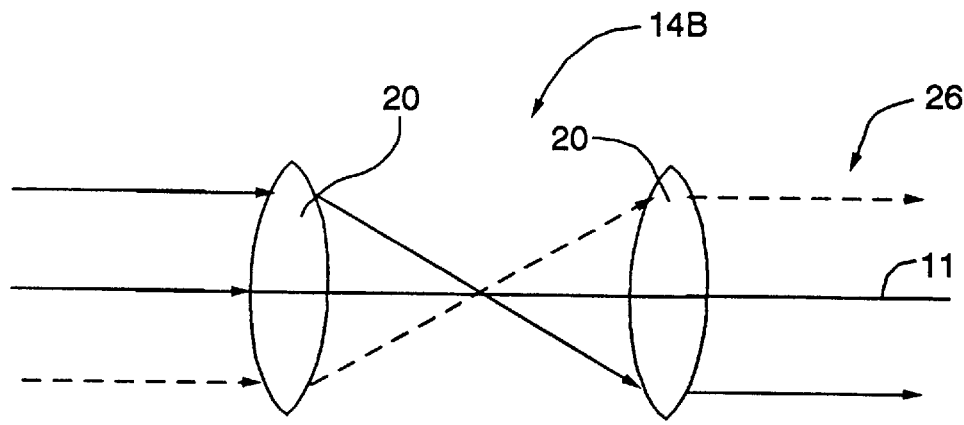
FIG. 8 is a side elevational view of a simple m=−1 afocal lens system demonstrating the effect of the same on collimated light.
Figure 9:
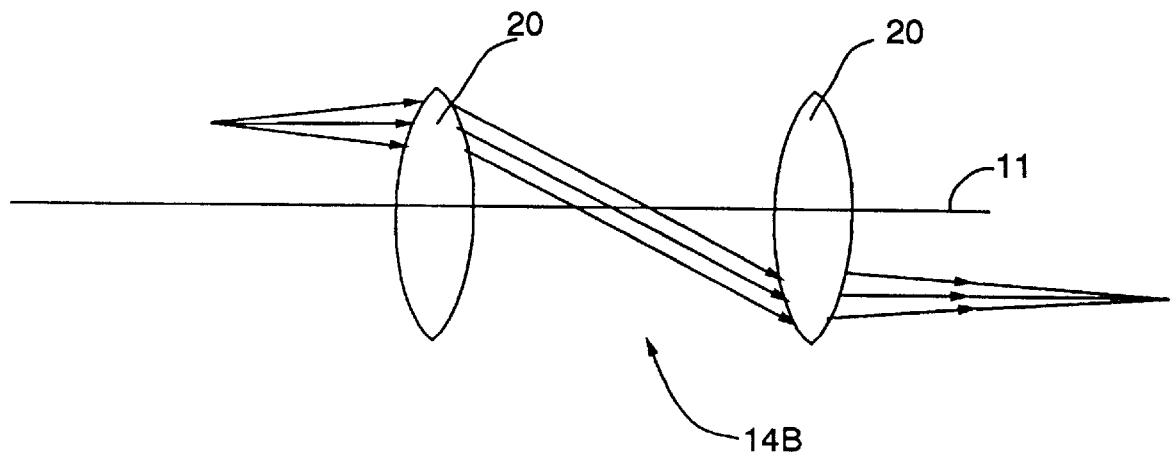
FIG. 9 is a side elevational view of a simple m=−1 afocal lens system imaging a point.

As shown in FIG. 7, image space 26 and object space 24 are again identical, but rotated 180 degrees on the x-y plane. For the purposes of imaging a three-dimensional circuit pattern, the results from using m=+1 and m=−1 magnifications are equally advantageous. An m=−1 lens system, denoted generally as 14B, can be designed more simply (FIG. 8 and FIG. 9) and is easier to build. FIG. 8 shows a simple example of an m=−1 lens system's 14B effect on collimated light and FIG. 9 demonstrates the system's imaging of a point. Of course, plane mirrors may be added within the system to arbitrarily orient the image space.

With either an m=+1 lens system 36 or an m=−1 lens system 14, a true 1:1 image is projected. Therefore, a circuit pattern imprinted on a mask in object space 24 will be projected exactly on a properly positioned substrate in image space 26. Therefore, even for the production of three-dimensional circuit carriers or substrates, a mask can be used which is identical in surface contour and features to be imaged to that of the product or substrate. Because variations in the z-dimension are imaged exactly, depth of focus considerations will be no greater than for two-dimensional, planar imaging. Further, the orientations and origin of mask 12 and target substrate 18 are not critical, so long as they are the same.

Figure 10:
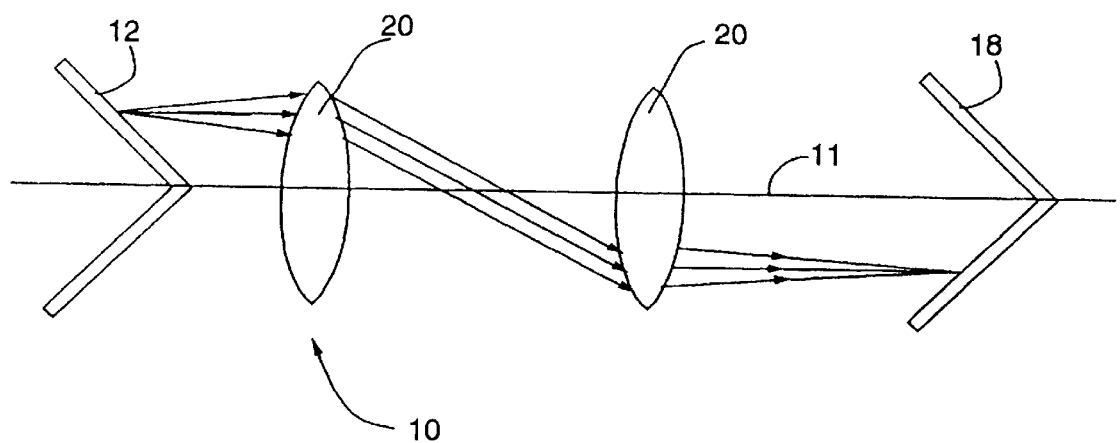
FIG. 10 is a side elevational view of the photolithography tool of the present invention imaging a point from the outer surface of an L-shaped mask to the inner surface of an L-shaped circuit carrier.
Figure 11:
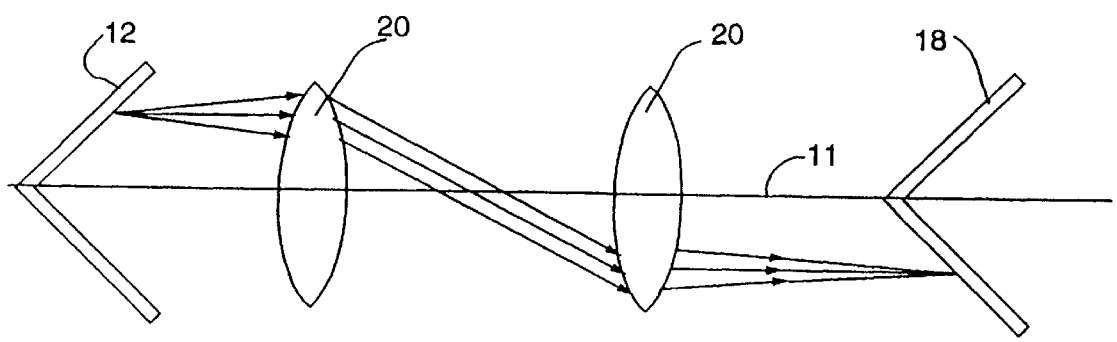
FIG. 11 is a side elevational view of the photolithography tool imaging a point from the inner surface of an L-shaped mask to the outer surface of an L-shaped circuit carrier.
Figure 12:
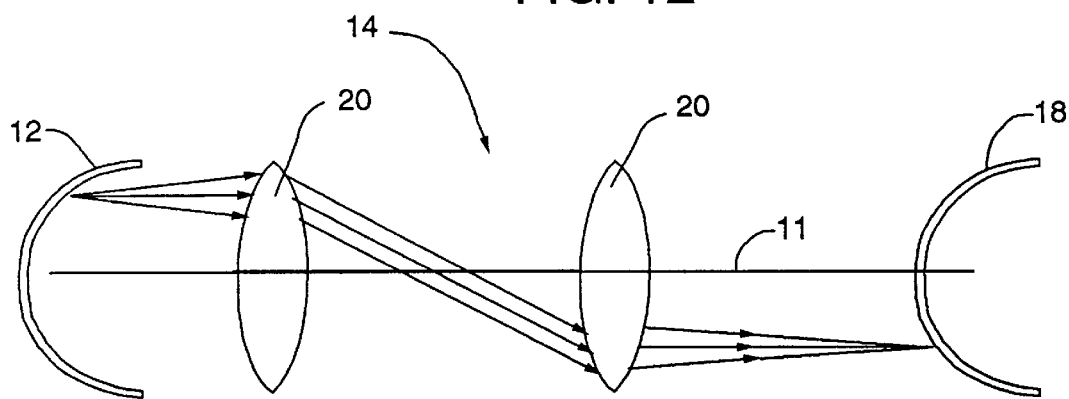
FIG. 12 is a side elevational view of the photolithography tool imaging a point from the inner surface of a non-planar mask to the outer surface of a non-planar circuit carrier.

Photolithography tool 10 may be used with a variety of masks 12 and substrate 18 configurations. The outside or inside of an angled mask 12 may be projected onto the inside or outside of substrate 18 (FIG. 10 and FIG. 11, respectively). Circuit pattern 12a printed on the inner or outer surface of mask 12 can be imaged on the outer or inner surface of substrate 18 (FIG. 12). The method is not limited to imaging on planar surfaces. Unit afocal lens system 14 images patterned mask 12 regardless of its shape, as demonstrated in FIG. 4A. This provides greatly expanded freedom in the design of the actual substrate 18.

Figure 13:
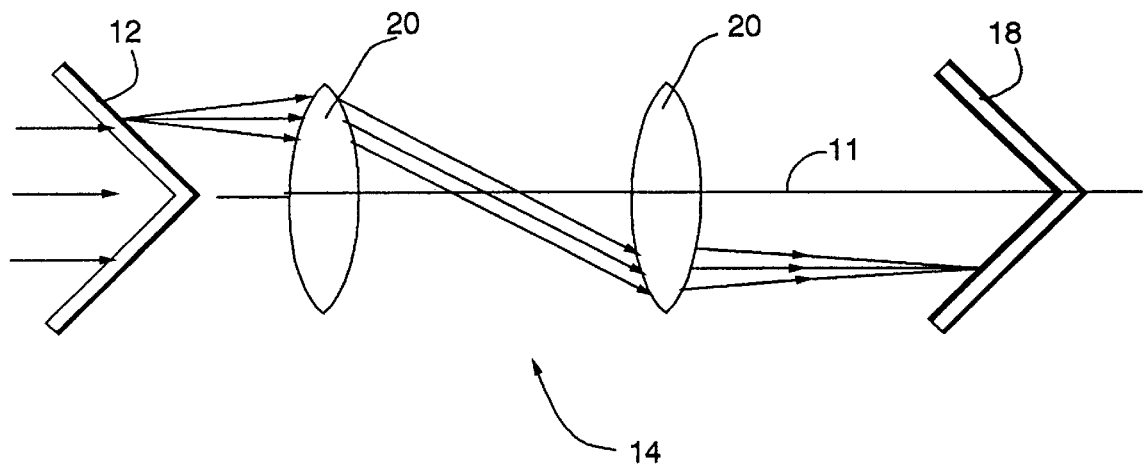
FIG. 13 is a side elevational view of the photolithography tool projecting a point from a three-dimensional mask via light transmission.
Figure 14:
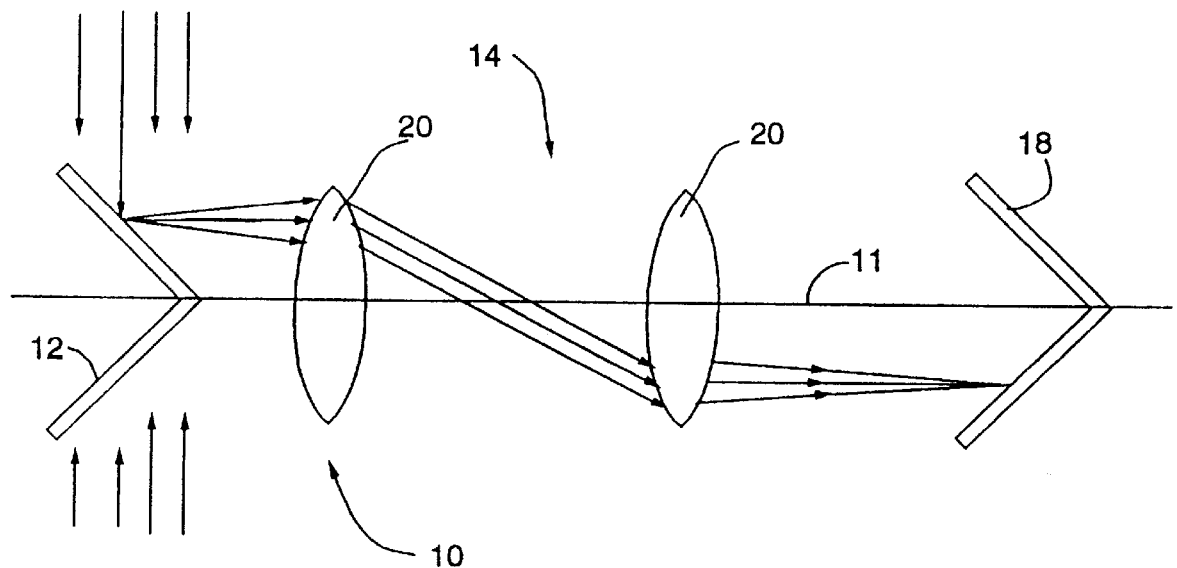
FIG. 14 is a side elevational view of the photolithography tool projecting a point from a three-dimensional mask via light reflection.
Figure 15:
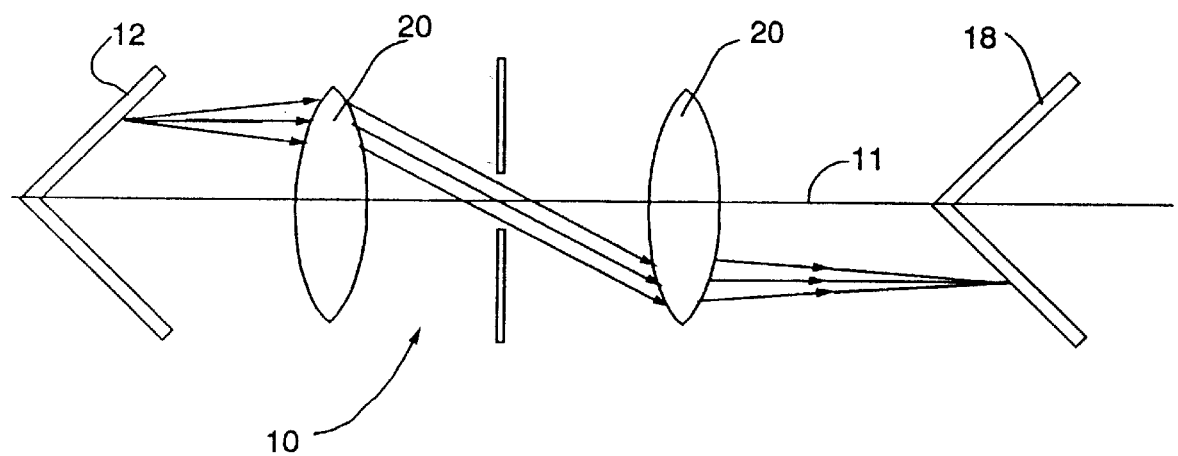
FIG. 15 is a side elevational view of a telecentric photolithography tool of the present invention.

Mask 12 may be used in transmission (FIG. 13) or in reflection (FIG. 14) or a combination of the two. As demonstrated in FIG. 15, a doubly telecentric afocal system can be designed so that image forming bundles 38 are parallel to lens axis 11 in both the object and the image spaces. If mask 12 or substrate 18 are defocused, blurring is produced, but the scale of image is not altered. Although the sharpness of each line may be less than optimal, the shape and relative positioning of lines will remain the same. Therefore, defocus tolerances in manufacturing will be limited by the degree of sharpness required of individual lines, and not by the relative distortion of lines in the circuit pattern; this telecentricity further relaxes requirements on positioning the mask and substrate—a distinct manufacturability advantage. (The system also allows thru-lens alignment and focusing).

The preferred embodiment of the present invention will depend on the overall size of the product and the size and complexity of the features to be printed.

Figure 16:
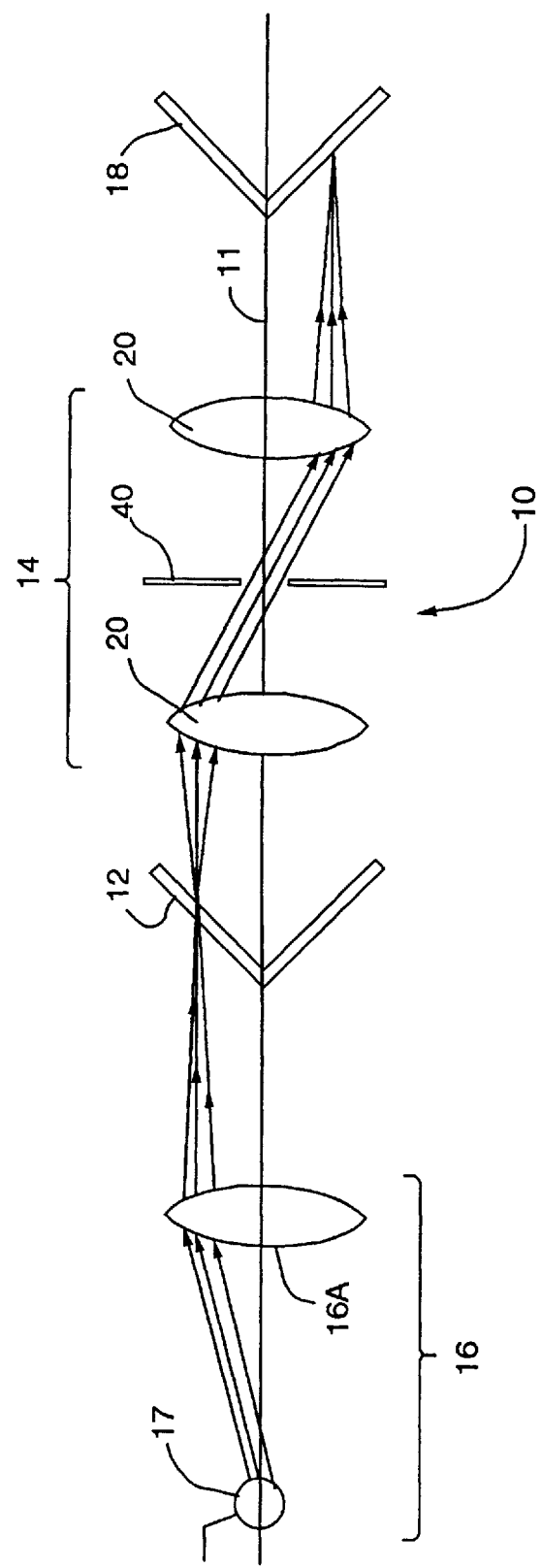
FIG. 16 is a side elevational view of the photolithography tool and a simple illuminator.
Figure 17:
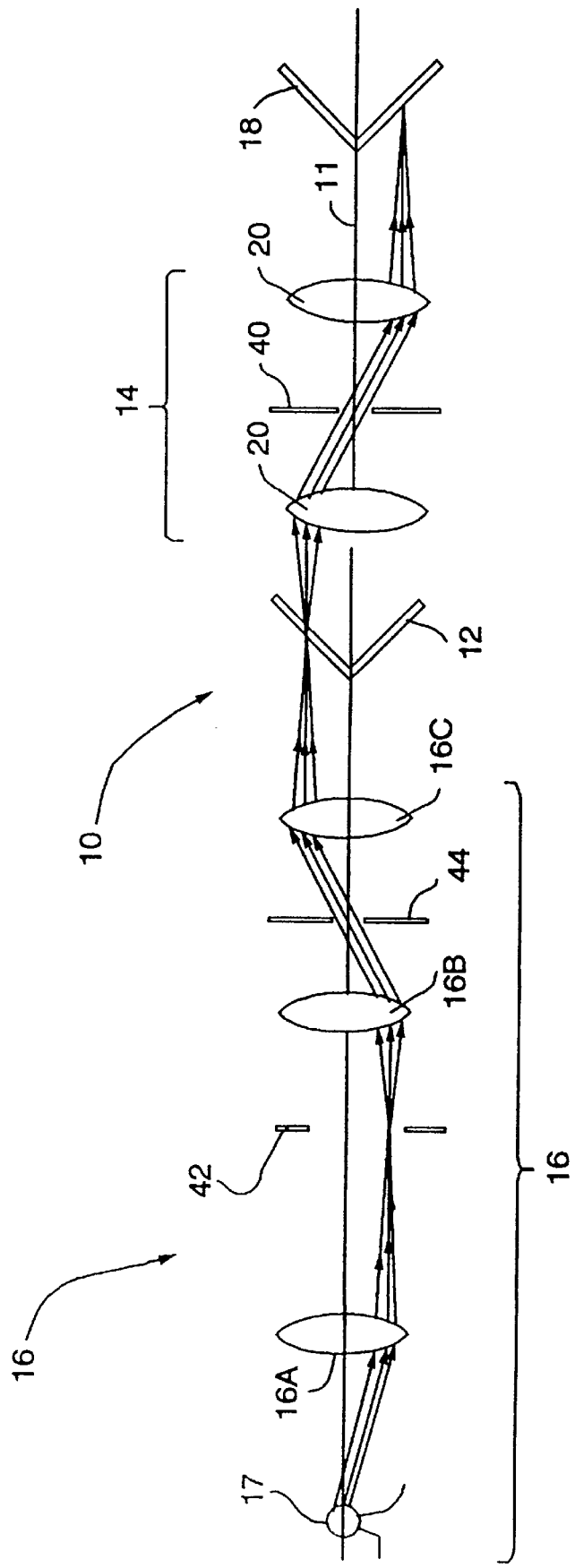
FIG. 17 is a side elevational view of the photolithography tool and an illuminator with more features.

Illuminator 16 may vary in design depending on the degree of sophistication required for the task. The simplest illuminator, shown in FIG. 16, includes condenser 16a and lamp 17 located at the front focal plane of condenser 16a. Aperture 40 is provided between the afocal lenses 20. An illuminator with more features 16 is shown in FIG. 17. In addition to lamp 17, condenser 16a, and aperture 40, illuminator 16 is provided with field stop 42, condensers 16b and 16c, and aperture 44. Field stop 42 located between the first two condensers, 16a and 16b, controls the illuminated area and may be an opening in a non-planar opaque surface, the position being approximately conjugate with the master surface. Aperture 44 positioned between the second and third condensers, 16b and 16c, controls the range of illumination angles.

To achieve high resolution, it is necessary for light to leave the patterned surface of three-dimensional mask 12 such that the images of all surfaces of mask 12 are adequately uniform in intensity. Uniformity is affected by both the geometry of the mask and the type of illumination utilized. For example, if a solid mask is illuminated by a collimated source parallel to the lens axis, then the rays emerging from the mask will be significantly refracted away from the lens axis. Consequently, a significant portion of the light incident to the mask may not be collected by the lens system and consequently provides non-uniform intensity. The exact uniformity required depends on the particular process. For example, particular photoresists require more or less uniformity and energy density.

Figure 18:
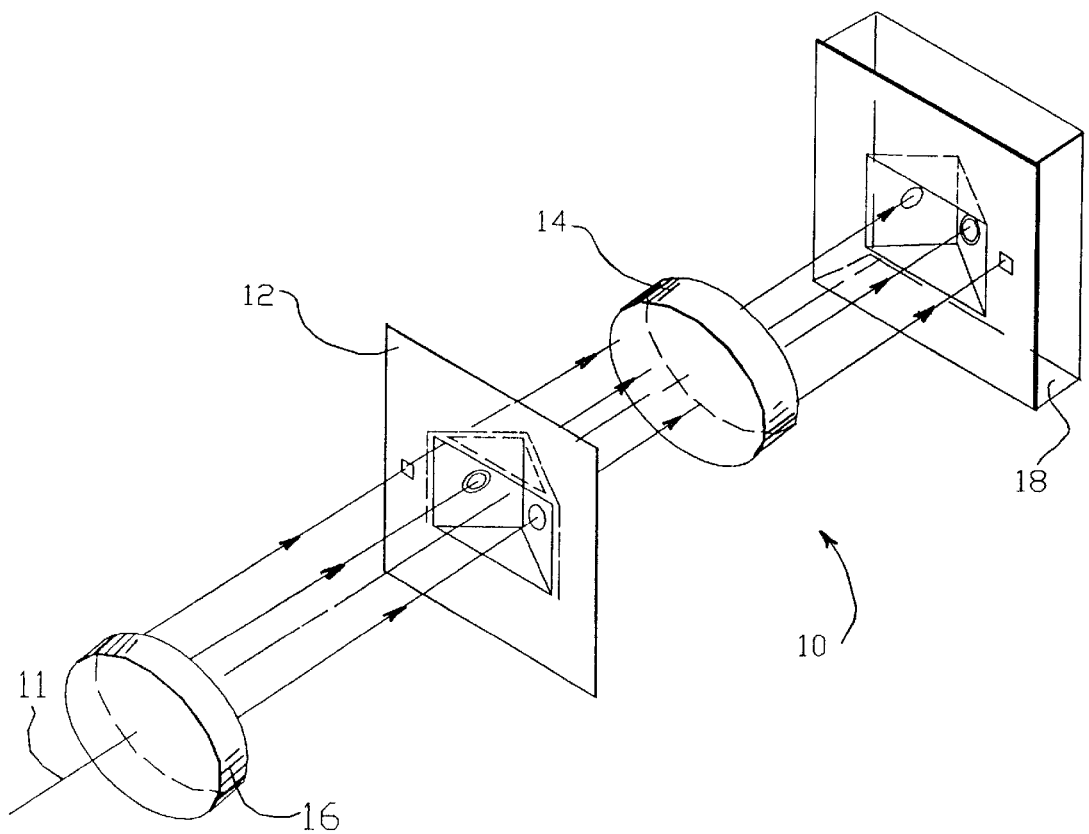
FIG. 18 is a perspective view of the photolithography tool including a specially shaped mask.
Figure 19:
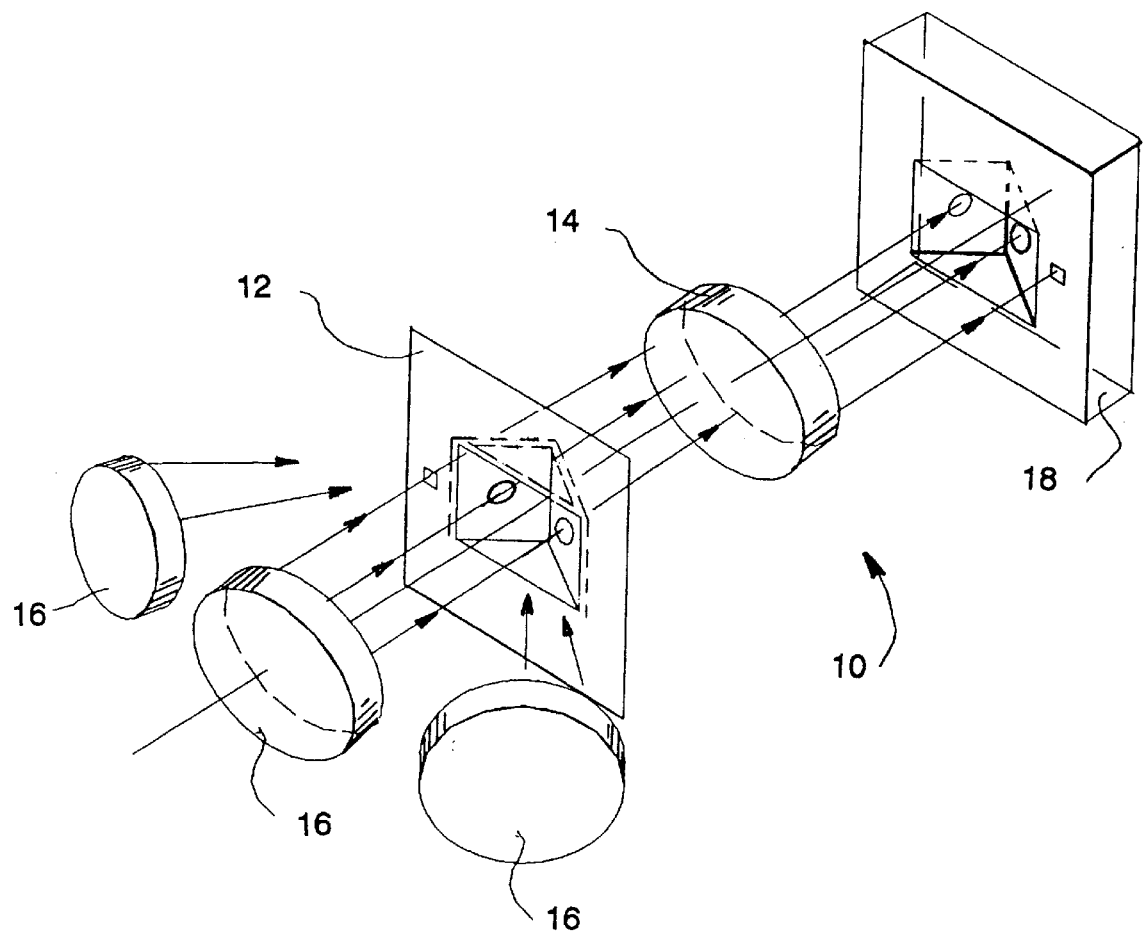
FIG. 19 is a perspective view of the photolithography tool and multiple illuminators.
Figure 20:
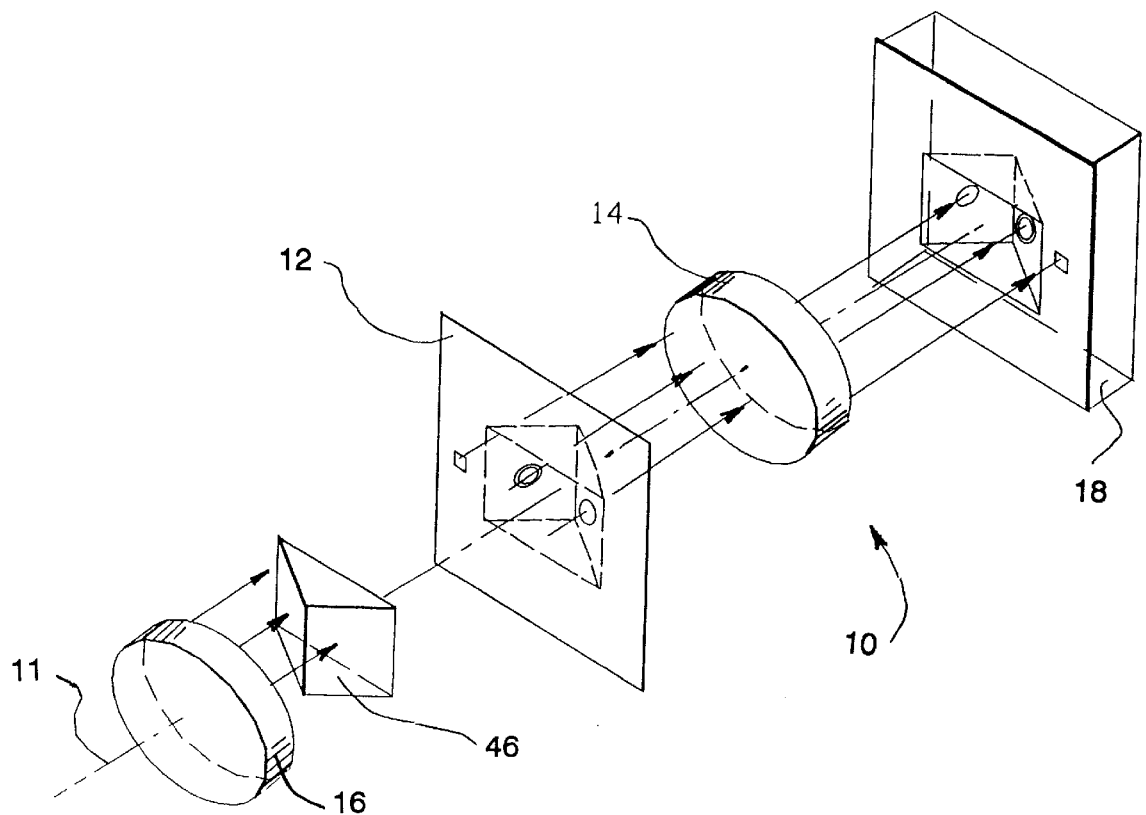
FIG. 20 is a perspective view of the photolithography tool including an illumination compensation element.

In order to achieve the required uniformity, a combination of mask structure and illumination is required, the design of which will depend on the particular shape to be printed. The preferred structure is that in which the illumination has a single principal direction (plus some divergence), and the required illumination is obtained by shaping the mask, as demonstrated in FIG. 18. There may not be a unique solution in each case. In addition to a specially shaped mask, illumination incident from a plurality of directions may be provided or moving the mask and object in sync with one another may be used. For example, if the mask surface consists of several planes, there may be a principal illumination direction for each (FIG. 19). Yet another method of increasing the degree of uniformity is the provision of illumination compensation element 46. As shown in FIG. 20, illumination compensation element 46 precedes mask 12 in the path of light and is designed to rearrange unidirectional light into suitable directions. Mask 12 itself may be thick or thin. Very thin masks could be supported by space frames. Masks 12 as shown in the figures are solid. Various refractive and anti-reflective coatings may also be incorporated on masks 12 to keep incident light from scattering away from afocal lens system 14. Still other solutions include immersing the mask and/or other portions of the system in materials with indices of refraction other than air.

One method for increasing uniformity of illumination when masters are constructed using thin or thick masks and substrates, space frames, or etched, formed masters is to immerse one or more of the system components in a material having a strategic index of refraction. The master and the product may be immersed in a material that has an index of refraction approximately the same as the index of master substrates. The master and the product are placed in a vessel of index matching material, such as oil, water, etc., where the sides of the vessel have one or more surfaces perpendicular to the lens axis. The illuminator, the lens systems, may also be placed in the vessel. The master and product may be freely rotated within the vessel. For an afocal lens system having unity magnification (M=+1 or M=−1) the magnification will remain unchanged both transversely and longitudinally when both the master and the product are immersed.

The longitudinal magnification (along the lens axis) of the system can be described by the following equation:

$$\frac{N'}{N} * M^2 - \text{longitudinal magnification}$$

Where N'=image space index of refraction;

N=object space index of refraction; and M=transverse magnification.

If only the master is immersed in the index matching material, the longitudinal magnification is changed while the transverse magnification remains the same. The discrepancy in dimensions along with the lens axis could be corrected for by modifying the design of the master.

The index matching methods described above allows masters to be used which are supported by thick substrates without distortion and prevents illumination intensity variations due to refraction. Furthermore, the finish of the substrate material is not critical. The possibility of contamination of the master surface is greatly reduced.

If desired, scanned illumination may be used since the photosensitive material on the product integrates light. The intensity and direction of light may be varied during scanning. Scanning would provide greater intensity and uniformity to compensate for refraction in thicker masks. For some mask shapes, it may be beneficial to use polarized illumination. Transmission and reflection may vary with polarization.

Although the invention has been described in terms of a preferred embodiment with various enhancements and alternative implementations, those skilled in the art will understand that other embodiments and variations may be carried out without detracting from the spirit of the invention. For example, the invention is not limited to a unity magnification afocal lens system; greater or lesser magnifications may also be used, and application of the technique and apparatus to other than circuit carriers is also easily possible.

We claim:

1. An imaging system including an illumination means for projecting a focused image on at least one exposure surface of a three-dimensional image space, comprising:

a) a three-dimensional master pattern bearing a desired pattern on at least one surface thereof;

b) an afocal lens system; and wherein, c) said three-dimensional master pattern, said afocal lens system, said image space, and said illumination means are relatively disposed such that said desired image is projected onto said exposure surface.

2. The imaging system of claim 1 wherein:

said exposure surface of said three-dimensional image space is coated with a photosensitive material such that when said desired image is projected onto said exposure surface, said pattern is reproduced thereon.

3. The imaging system of claim 1 wherein:

said three-dimensional master pattern is substantially identical in size and shape to a three-dimensional circuit carrier.

4. The imaging system of any one of claims 1 through 3 wherein:

said afocal lens system includes at least one afocal lens.

5. The imaging system of claim 4 wherein:

there are two or more of said afocal lenses and said lenses are disposed relative to one another to share a common lens axis and are parallel to one another and said afocal lenses have equivalent focal lengths and are separated by twice their focal length.

6. The imaging system of claim 5 wherein:

said afocal lens has a unity magnification.

7. A method of projecting a desired image onto at least one exposure surface of a three-dimensional image space using a three-dimensional master having said desired image thereon, an illuminator, and an afocal lens system including at least one afocal lens capable of imaging three-dimensional objects onto three-dimensional spaces, comprising the steps of:

a) illuminating said three-dimensional master with said illuminator such that light leaving said three-dimensional master passes through said afocal lens system; and b) directing light, by means of said afocal lens system, from said three-dimensional master onto said exposure surface of said three-dimensional image space such that said desired image is reproduced on said exposure surface.

8. The method of claim 7, further including a step of:

positioning said illuminator, said three-dimensional master, and said afocal lens system such that light incident to said three-dimensional master is reflected into said afocal lens system.

9. The method of claim 7 further including a step of:

positioning said illuminator, said three-dimensional master, and said afocal lens system such that light incident to said three-dimensional master is transmitted through said three-dimensional master into said afocal lens system.

10. A method of projecting a focused image onto at least one exposure surface of a three-dimensional object surface using a three-dimensional master having a desired pattern thereon, an illuminator, and an afocal lens system which images three-dimensional objects onto three-dimensional spaces, comprising the steps of:

a) emitting light from said illuminator;

b) positioning said three-dimensional master in the path of light from said illuminator;

c) positioning said afocal lens system in the path of light leaving said three-dimensional master; and d) exposing said exposure surface to light leaving said afocal lens system such that said desired pattern is reproduced thereon.

* * * * *